United States Patent
Takahashi et al.

(10) Patent No.: US 6,524,968 B2
(45) Date of Patent: Feb. 25, 2003

(54) METHOD FOR FORMING INSULATING FILM AND FOR MANUFACTURING INTEGRATED CIRCUIT

(75) Inventors: Masashi Takahashi, Kanagawa (JP); Toshio Nagata, Tokyo (JP); Yoshirou Tsurugida, Miyazaki (JP); Takashi Ohsako, Tokyo (JP); Hirotaka Mori, Miyagi (JP); Akihiko Ohara, Tokyo (JP); Hidetsugu Uchida, Tokyo (JP); Hiroaki Uchida, Yamanashi (JP); Katsuji Yoshida, Tokyo (JP); Masahiro Takahashi, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/970,692

(22) Filed: Oct. 5, 2001

(65) Prior Publication Data
US 2003/0008523 A1 Jan. 9, 2003

(30) Foreign Application Priority Data
Jul. 6, 2001 (JP) .......................... 2001-205530

(51) Int. Cl.$^7$ ................................ H01L 21/31
(52) U.S. Cl. ....................... 438/758; 438/780; 438/781; 438/789
(58) Field of Search ................................ 438/758, 780, 438/781, 789, 790, 305, 307, 308; 427/569

(56) References Cited

U.S. PATENT DOCUMENTS

| | | |
|---|---|---|
| 4,355,271 A | 10/1982 | Noack |
| 4,620,141 A | 10/1986 | McCumber et al. |
| 4,652,745 A | 3/1987 | Zanardelli |
| 4,798,956 A | 1/1989 | Hochstein |
| 4,859,867 A | 8/1989 | Larson et al. |
| 4,867,561 A | 9/1989 | Fuji et al. |
| 4,871,917 A | 10/1989 | O'Farrell et al. |
| 4,916,307 A | 4/1990 | Nishibe et al. |
| 4,916,374 A | 4/1990 | Schierbeek et al. |

(List continued on next page.)

FOREIGN PATENT DOCUMENTS

| | | |
|---|---|---|
| DE | 2946561 | 5/1981 |
| DE | 4424454 | 1/1996 |
| DE | 19803694 | 1/1998 |
| EP | 0479169 | 4/1992 |
| EP | 0832798 | 9/1997 |
| GB | 2056059 | 3/1981 |
| JP | 9-126998 | 5/1997 |
| JP | 11-283975 | 10/1999 |
| WO | 9427262 | 11/1994 |
| WO | 9501561 | 1/1995 |
| WO | 9923828 | 5/1999 |
| WO | 9947396 | 9/1999 |
| WO | 0053465 | 9/2000 |

OTHER PUBLICATIONS

Kumi Motai, "The Effect of IPA Adsorption on Thin Oxide," Extended Abstracts of the 1997 International Conference on Solid State Devices and Materials, Hamamatsu, 1997, pp. 24–25.
Patent Abstract of Japanese Publication No. 59199347, published Nov. 12, 1984, entitled Wiper Controller for Vehicle.

Primary Examiner—John F. Niebling
Assistant Examiner—Olivia Luk
(74) Attorney, Agent, or Firm—Volentine Francos, PLLC

(57) ABSTRACT

A method for forming an insulating film is provided which is capable of inhibiting spontaneous growth of a silicon oxide film formed on a silicon substrate and an increase in thickness of a film caused by exposure to an atmosphere. After having allowed a silicon dioxide layer with a predetermined thickness to grow on a surface of a silicon crystal, a surface of the silicon dioxide is exposed to organic gas containing no hydroxyl group or is exposed to ammonia gas.

21 Claims, 3 Drawing Sheets

Si:SILICON ATOM
O:OXYGEN ATOM
H:HYDROGEN ATOM
N:NITROGEN ATOM

U.S. PATENT DOCUMENTS

| | | |
|---|---|---|
| 4,930,742 A | 6/1990 | Schofield et al. |
| 4,956,591 A | 9/1990 | Schierbeek et al. |
| 4,960,996 A | 10/1990 | Hochstein |
| 4,973,844 A | 11/1990 | O'Farrell et al. |
| 4,987,354 A | 1/1991 | Steinmann |
| 5,022,961 A * | 6/1991 | Izumi et al. ................. 156/646 |
| 5,276,389 A | 1/1994 | Levers |
| 5,306,992 A | 4/1994 | Dröge |
| 5,313,072 A | 5/1994 | Vachss |
| 5,336,980 A | 8/1994 | Levers |
| 5,386,111 A | 1/1995 | Zimmerman |
| 5,483,446 A | 1/1996 | Butzer |
| 5,498,866 A | 3/1996 | Bendicks et al. |
| 5,581,240 A | 12/1996 | Egger |
| 5,598,146 A | 1/1997 | Schröder |
| 5,659,294 A | 8/1997 | Schröder |
| 5,661,303 A | 8/1997 | Teder |
| 5,663,542 A | 9/1997 | Kohr et al. |
| 5,703,568 A | 12/1997 | Hegyi |
| RE35,762 E | 4/1998 | Zimmerman |
| 5,796,094 A | 8/1998 | Schofield et al. |
| 5,796,106 A | 8/1998 | Noack |
| 5,811,793 A | 9/1998 | Pientka |
| 5,818,600 A | 10/1998 | Bendicks et al. |
| 5,821,863 A | 10/1998 | Schröder |
| 5,851,892 A * | 12/1998 | Lojek et al. ................. 438/305 |
| 5,872,437 A | 2/1999 | Pientka et al. |
| 5,923,027 A | 7/1999 | Stam et al. |
| 5,953,591 A * | 9/1999 | Ishihara et al. ............. 438/115 |
| 6,008,486 A | 12/1999 | Stam et al. |
| 6,020,247 A | 2/2000 | Wilk et al. ................... 438/398 |
| 6,097,024 A | 8/2000 | Stam et al. |
| 6,118,383 A | 9/2000 | Hegyi |
| 6,162,667 A * | 12/2000 | Funai et al. ................. 438/166 |
| 6,207,967 B1 | 3/2001 | Hochstein |
| 6,240,610 B1 * | 6/2001 | Ishihara et al. ............. 29/25.01 |
| 6,245,606 B1 | 6/2001 | Wilk et al. ................... 438/216 |
| 6,245,690 B1 * | 6/2001 | Yau et al. .................... 438/780 |
| 6,294,469 B1 * | 9/2001 | Kulkarni et al. ............ 438/689 |
| 6,313,454 B1 | 11/2001 | Bos et al. |
| 6,320,176 B1 | 11/2001 | Schofield et al. |
| 2001/0026849 A1 * | 10/2001 | Yau et al. .................... 427/569 |
| 2001/0049193 A1 * | 12/2001 | Golecki et al. ............. 438/674 |
| 2002/0019112 A1 * | 2/2002 | Farrar ........................ 438/424 |

* cited by examiner

21:NH3  16:Ar  15:O2
20:CnHm

Si:SILICON ATOM
O:OXYGEN ATOM
H:HYDROGEN ATOM
CnHm:ORGANIC GAS

Si:SILICON ATOM
O:OXYGEN ATOM
H:HYDROGEN ATOM
N:NITROGEN ATOM

METHOD FOR FORMING INSULATING FILM AND FOR MANUFACTURING INTEGRATED CIRCUIT

BACKGROUND OF THE INVENTION

1. Field of the Invention

The present invention relates to a method for forming an insulating film suitably used as a gate insulator for an FET (Field Effect Transistor) such as a MOS (Metal Oxide Semiconductor) transistor embedded in an integrated circuit or as a dielectric film for a capacitor and to a method for manufacturing the integrated circuit using the above method for forming the insulating film.

2. Description of the Related Art

A thickness of the gate insulator for the MOS transistor to be embedded in the integrated circuit, in order to provide a predetermined electrical property to the MOS transistor, has to be controlled precisely.

It is possible to form a silicon dioxide film having a desired thickness comparatively precisely by using a method disclosed in Japanese Patent Application Laid-open No. Hei 11-283975 in which a surface of a silicon substrate is exposed to ozone and an environmental temperature is suitably controlled.

However, even if the silicon dioxide film having the desired thickness is formed on the silicon substrate, when the silicon dioxide film formed on the silicon substrate is exposed to an atmosphere, due to spontaneous oxidation of the silicon substrate, the silicon dioxide ($SiO_2$) film continues growth. When it is left in the atmosphere for five hours, an amount of an increase in a thickness of the silicon dioxide film is up to 0.1 nm to 0.5 nm.

Therefore, when a thickness of a gate oxide film to be used for the MOS transistor has to be, for example, 2 nm, by employing the above conventional method, the silicon dioxide film having the precise thickness of 2 nm can be formed, however, the thickness of the gate oxide film composed of the silicon dioxide film is larger by 5% to 25% than the originally desired thickness. As a result, the growth of the gate oxide film caused by the spontaneous oxidation greatly changes the electrical properties of the MOS transistor. Moreover, since the gate oxide film having such the increased thickness occurs in the region of a semiconductor wafer in a non-uniform manner, when many MOS transistors are formed collectively on the semiconductor wafer, a great variation in the electrical properties occurs in each of the MOS transistors.

SUMMARY OF THE INVENTION

In view of the above, it is an object of the present invention to provide a method for forming an insulating film which is capable of inhibiting a spontaneous growth of a silicon dioxide film formed on a silicon substrate and of inhibiting an increase in thickness of the silicon dioxide film caused by exposure to an atmosphere.

It is another object of the present invention to provide a method for manufacturing an integrated circuit which is capable of preventing a variation in electrical properties caused by dispersion in thickness of the insulating film by controlling the dispersion in the thickness of the insulating film.

According to a first aspect of the present invention, there is provided a method for forming an insulating film made up of silicon dioxide on a silicon crystal including:

a step of allowing the silicon dioxide having a predetermined thickness to grow on the silicon crystal; and a step of exposing a surface of the silicon dioxide to organic gas containing no hydroxyl group.

In the above aspect, it is desirable that low-molecular organic gas is used as the organic gas containing no hydroxyl group, which includes typically methane gas and ethane gas which are a paraffin saturated hydrocarbon. Moreover, unsaturated hydrocarbon such as ethylene or propylene may be used also as the organic gas.

In the foregoing, a preferable mode is one wherein the organic gas is paraffin low-molecular gas.

Also, a preferable mode is one wherein a growth of the silicon dioxide occurs by exposing the silicon dioxide to an atmosphere of ozone and, after the silicon dioxide has grown until it has a predetermined thickness, the ozone in the atmosphere is replaced with nitrogen gas or inert gas and then, organic gas containing no hydroxyl group is introduced into the atmosphere, in order to expose the surface of the silicon dioxide to the organic gas.

In the above aspect, to prevent reaction of the ozone with the ammonia gas, it is preferable that, after the silicon dioxide has grown until it has the predetermined thickness, prior to the introduction of the ammonia gas into the atmosphere, the ozone in the atmosphere is replaced with the nitrogen gas or the inert gas.

According to a second aspect of the present invention, there is provided a method for forming an insulating film made up of silicon dioxide on a silicon crystal, the method including:

a step of allowing the silicon dioxide having a predetermined thickness on a surface of the silicon crystal; and a step of terminating binding of a dangling bond of a silicon atom on the surface of the silicon dioxide by causing a nitrogen atom to bind to the dangling bond of the silicon atom.

In the above aspect, when the surface of the silicon dioxide is exposed to the organic gas, the nitrogen atom in the organic gas binds to the gangling bond of the silicon atom to terminate the growth of the silicon dioxide or the organic gas component is adsorbed on the surface of the silicon dioxide layer by van der Waals force. Since the organic gas effectively inhibits permeation of an oxygen molecule, the growth of the silicon dioxide caused by spontaneous oxidation can be efficiently prevented.

In the foregoing, a preferable mode is one wherein a growth of the silicon dioxide occurs by exposing a crystal face of the silicon dioxide to an atmosphere of ozone and, after the silicon dioxide has grown until it has a predetermined thickness, the ozone in the atmosphere is replaced with nitrogen gas or inert gas, and then ammonia gas is introduced into the atmosphere in order to cause a dangling bond of a silicon atom on a surface of the silicon dioxide to bind to a nitrogen atom.

According to a third aspect of the present invention, there is provided a method for manufacturing an integrated circuit including:

a process of forming an insulating film made up of silicon dioxide on a silicon crystal, which includes a step of allowing silicon dioxide having a predetermined thickness to grow on a surface of the silicon crystal by exposing a crystal face of the silicon dioxide to an atmosphere of ozone, a step of replacing the ozone in the atmosphere with nitrogen gas or inert gas after the silicon dioxide has grown until it has a predetermined thickness, and a step of introducing organic gas containing no hydroxyl group into the atmosphere in order to expose a surface of the silicon dioxide to the organic gas.

In the foregoing, a preferable mode is one wherein the insulating film is a gate insulator of an field effect transistor or a dielectric film of a capacitor.

According to a fourth aspect of the present invention, there is provided a method for manufacturing an integrated circuit including:

a process of forming an insulating film made up of silicon dioxide on a silicon crystal, which includes a step of allowing the silicon dioxide having a predetermined thickness to grow on a surface of the silicon crystal by exposing a crystal face of the silicon dioxide to an atmosphere of ozone, a step of replacing the ozone in the atmosphere with nitrogen gas or inert gas after the silicon dioxide has grown until it has a predetermined thickness, and a step of introducing ammonia gas into the atmosphere in order to cause a dangling bond of a silicon atom on a surface of the silicon dioxide to bind to a nitrogen atom.

In the above aspect, the nitrogen atom to terminate the binding of the silicon atom on the surface of the silicon dioxide effectively inhibits the permeation of the oxygen molecule and therefore the growth of the silicon dioxide can be efficiently prevented.

In the foregoing, a preferable mode is one wherein the insulating film is a gate insulator of an field effect transistor or a dielectric film of a capacitor.

With the above configurations, since the permeation of an oxygen molecule into silicon existing under the silicon dioxide can be inhibited by exposing the surface of the silicon dioxide to organic gas containing no hydroxyl group, the increase in film thickness caused by spontaneous oxidation of the silicon dioxide can be prevented, thus enabling the thickness of the film to be maintained at a proper level. Moreover, the permeation of the oxygen molecule into silicon existing under the silicon dioxide can be prevented by terminating the binding of the dangling bond of the silicon atom on the surface of the silicon dioxide by nitrogen atoms and therefore the increase in film thickness caused by spontaneous oxidation of the silicon dioxide can be avoided, thus enabling the thickness of the film to be maintained at a proper level. Furthermore, by applying the method for forming the insulating film to formation of gate oxide films of MOS transistors in integrated circuits or to dielectric films of capacitors, manufacturing of the integrated circuit exhibiting a homogenous property having no variations in electronic characteristics is made possible.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Best modes of carrying out the present invention will be described in further detail using various embodiments with reference to the accompanying drawings.

FIRST EMBODIMENT

Figure 1:
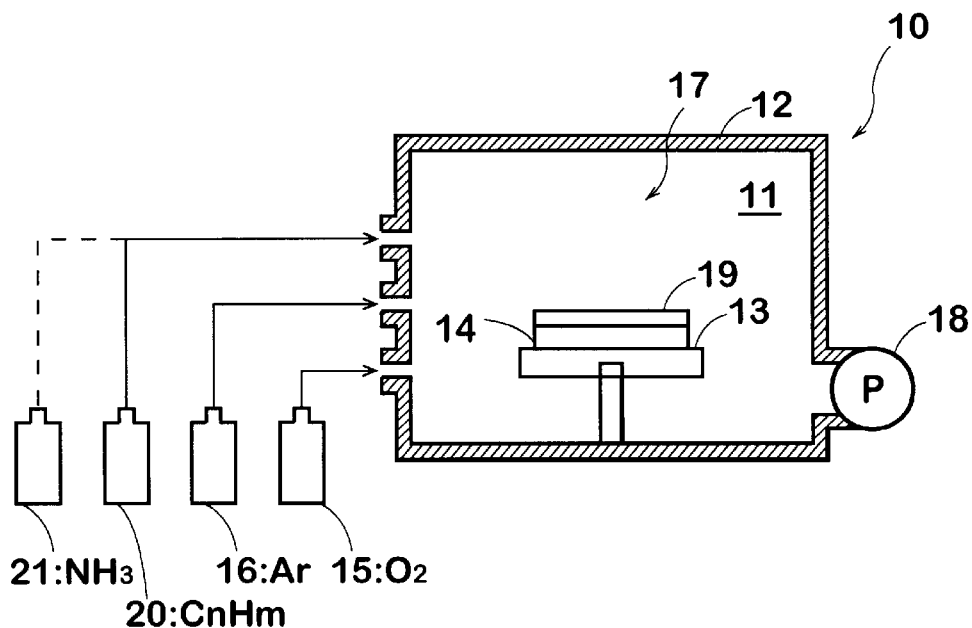
FIG. 1 is a cross-sectional view schematically showing an apparatus to perform a method for forming an insulating film according to a first embodiment of the present invention.

FIG. 1 is a schematic block diagram showing an apparatus to perform a method for forming an insulating film of a first embodiment of the present invention.

The insulating film forming apparatus 10 of the first embodiment of the present invention is provided with a housing 12 defining a reaction chamber 11 and a sample stage 13 placed in the housing 12. On the sample gate 13 is held, for example, a silicon crystal substrate 14 with its surface facing upward so that the silicon dioxide film serving as the insulating film grows.

In order to allow the silicon dioxide film having a predetermined thickness to grow on the silicon crystal substrate 14, an inside of the reaction chamber 11 is kept under an atmosphere of ozone, in the same manner as disclosed in the conventional method. Moreover, to provide such the atmosphere in the inside of the reaction chamber 11, oxygen fed from an oxygen source 15 and inert gas such as argon fed from an inert gas source 16 connected to one end of the reaction chamber 11 are supplied into the reaction chamber 11. In the inside of the reaction chamber 11, ultraviolet rays are applied and part of the oxygen in the reaction chamber 11 changes to ozone by irradiation of the ultraviolet rays. To the other end of the reaction chamber 11 is connected a well-known exhaust source 18 adapted to maintain a pressure in the reaction chamber 11 at a predetermined level.

Using the insulating film forming apparatus 10, the silicon dioxide layer 19 having a thickness of, for example, 1 nm to 2 nm can be allowed to grow through oxidation by maintaining a temperature in the reaction chamber 11 at a proper level. Moreover, since its growth reaches saturation regardless of a lapse of time for oxidation processing, it is possible comparatively easily to allow the silicon dioxide layer 19 having the predetermined thickness to grow.

When the silicon crystal substrate 14 on which the silicon dioxide layer 19 having the predetermined thickness is exposed to the atmosphere, oxygen atoms in the atmosphere having passed through the silicon dioxide layer 19 bind to silicon atoms contained in the silicon crystal substrate 14 existing under the silicon dioxide layer 19, as a result, causing the silicon dioxide layer 19 to continue growing. In order to inhibit the continuous growth of the silicon dioxide layer 19, oxidation inhibiting processing of the present invention is performed on a surface of the silicon dioxide layer 19.

By the oxidation inhibiting processing, a supply of oxygen to the insulating film forming apparatus 10 is stopped. Then, to remove the residual ozone from the reaction chamber 11, a supply of argon gas from the inert gas source 16 is continued. After almost all the ozone in the reaction chamber 11 has been replaced with the argon gas by the supply of the argon gas, organic gas is supplied from an organic gas source 20 into the reaction chamber 11. By the supply of the organic gas, the inside of the reaction chamber 11 is kept under an atmosphere of the organic gas with temperatures of, for example, 25° C. to 200° C., for 5 minutes to 10 minutes.

As the organic gas fed from the organic gas source 20, low-molecular paraffin aliphatic hydrocarbon (CnHm: C denotes a carbon atom, H denotes a hydrogen atom, "n" and "m" denote natural numbers) such as methane gas, ethane gas or a like which are saturated hydrocarbon containing no alcohol group.

Generally, when the organic gas contacts ozone, it reacts with the ozone and is subjected to combustion. However, in the embodiment, prior to the supply of the organic gas into the reaction chamber 11, since the ozone in the reaction chamber 11 has been replaced with the argon gas, even if the organic gas is fed into the reaction chamber 11 from the organic gas source 20, the organic gas is not subjected to combustion. As the inert gas used for the replacement of the ozone, various inert gas including helium, neon or a like can be used. Moreover, instead of the inert gas, nitrogen gas can be used.

Figure 2:
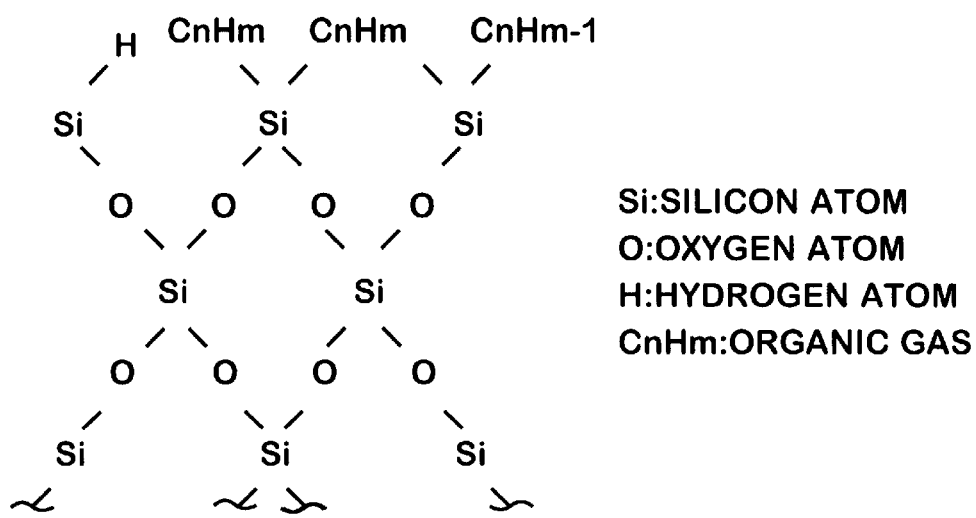
FIG. 2 is a schematic diagram showing structures of atoms existing on a surface of a silicon dioxide film employed in the method for forming the insulating film according to the first embodiment of the present invention.

When the organic gas is fed into the reaction chamber 11, carbon atoms contained in the organic gas bind to dangling bonds of the silicon atoms existing on the surface of the silicon dioxide layer 19 on the silicon crystal substrate 14 in the reaction chamber 11, that is, the bonding of the silicon atoms to the oxygen atoms is terminated by the bonding of carbon atoms contained in the organic gas component (CnHm) to the silicon atoms, as shown in FIG. 2. Moreover, though not shown, the organic gas component is adsorbed on the surface of the silicon dioxide layer 19 by van der Waals force.

Both the organic gas component used to terminate the bonding of the silicon atoms existing on the surface of the silicon dioxide layer 19 to the oxygen atoms and the organic gas component being adsorbed on the surface of the silicon dioxide layer 19, by inhibiting permeation of the oxygen molecule into the silicon dioxide layer 19, prevent the oxidation of the silicon crystal substrate 14 existing under the silicon dioxide layer 19.

Thus, when the silicon dioxide layer 19 on the silicon crystal substrate 14 which has undergone the oxidation inhibiting processing of the present invention is exposed to the atmosphere, the growth of the silicon dioxide layer 19 induced by the oxidation of the silicon crystal substrate 14 can be effectively prevented.

As the organic gas described above, the use of alcohols containing the hydroxyl group can be thought, however, when the silicone dioxide layer 19 is used as the component of electronic circuit elements, if the hydroxyl group is bonded to molecules making up the silicon dioxide layer 19, there is a fear that the contained hydroxyl group forms trap level which causes degradation of the electrical properties. Therefore, it is preferable that the organic gas whose molecules contain no hydroxyl group is employed, as described above.

Moreover, as the organic gas described above, instead of the methane gas or ethane gas, low-molecular organic gas containing no alcohol group and being unsaturated hydrocarbon such as ethylene, propylene or a like can be used. Organic gas other than those described above may be selected as appropriate.

SECOND EMBODIMENT

In the above first embodiment, the organic gas is adsorbed on the surface of the silicon dioxide layer 19 or the growth of the silicon dioxide layer 19 is terminated by using the organic gas. However, in a second embodiment, by causing dangling bonds of the silicon atom existing on the surface of the silicon dioxide layer 19 to bind to nitrogen atoms, the bonding of the silicon atom is terminated to inhibit the growth of the silicon dioxide layer 19.

In the second embodiment, in order to cause the dangling bonds of the silicon atoms existing on the surface of the silicon dioxide layer 19 to bind to the nitrogen atoms to inhibit the growth of the silicon dioxide layer 19, instead of the organic gas source 20 shown in FIG. 1, an ammonia gas source 21 is provided. After the silicon dioxide layer 19 having a predetermined thickness has been allowed to grow on the silicon crystal substrate 14 in the same manner as in the first embodiment, in order to prevent the reaction of ammonia gas with ozone, the zone in the reaction chamber 11 is replaced with, for example, argon gas fed from the inert gas source 16, prior to introduction of the ammonia gas fed from the ammonia gas source 21 into the reaction chamber 11.

Then, an amount of ammonia gas of, for example, 10 c.c. is supplied from the ammonia gas source 21 into the reaction chamber 11 and the inside of the reaction chamber 11 is kept under an atmosphere of the ammonia gas with temperatures of, for example, 300° C. to 400° C., for 5 minutes to 10 minutes.

Figure 3:
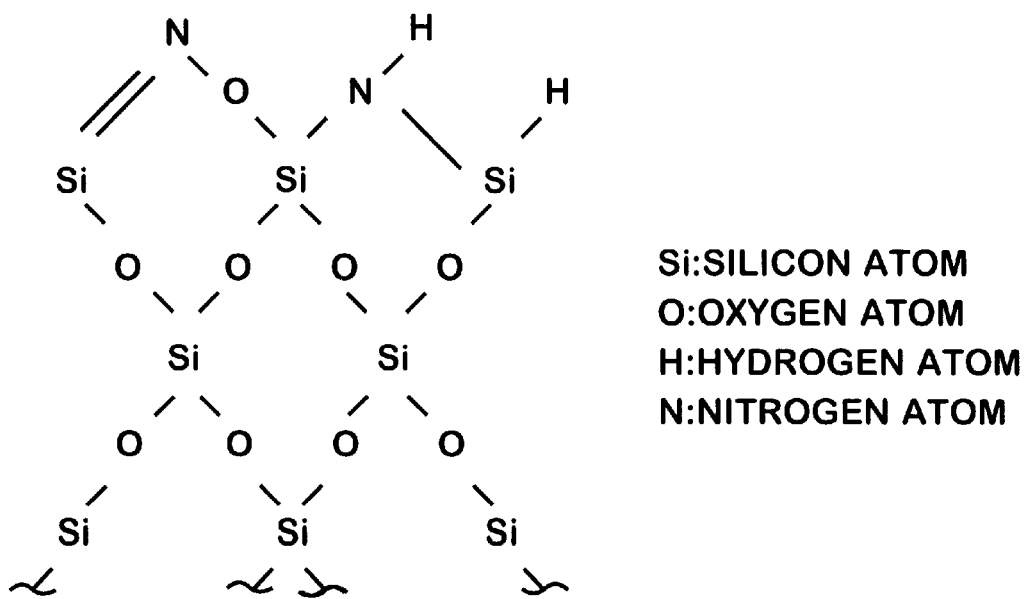
FIG. 3 is a schematic diagram showing structures of atoms existing on a surface of the silicon dioxide film employed in a method for forming the insulating film according to a second embodiment of the present invention.

As shown in FIG. 3, in the atmosphere of the ammonia gas, the bonding of the silicon atom existing on the surface of the silicon dioxide layer 19 on the silicon substrate 14 is terminated by the bonding of the nitrogen atoms to the gangling bonds of the silicon atom and the bonding of the oxygen atom is terminated by the bonding of the nitrogen atoms to the gangling bonds of the oxygen atom.

The above nitrogen atoms used to terminate the bonding of the silicon atoms and oxygen atoms contained in the silicon dioxide layer 19, by inhibiting the permeation of oxygen molecules into the silicon dioxide layer 19, prevent the oxidation of the silicon substrate existing under the silicon dioxide layer 19.

Thus, when the silicon dioxide layer 19 on the silicon crystal substrate 14 which has undergone the oxidation inhibiting processing of the present invention is exposed to the atmosphere, the growth of the silicon dioxide layer 19 induced by the oxidation of the silicon crystal substrate 14 can be effectively prevented.

Figure 4:
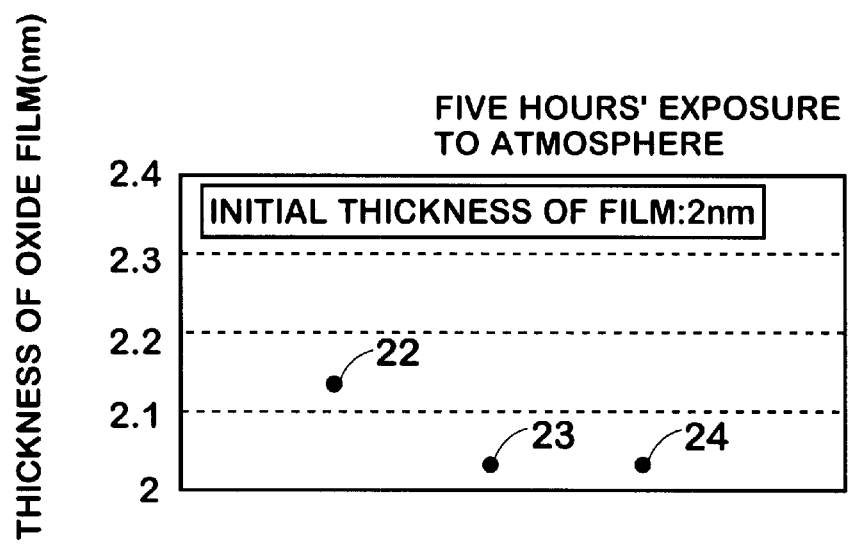
FIG. 4 is a graph showing results of comparison in thickness, which are obtained after five hours' exposure to an atmosphere, between the silicon dioxide layer formed by using the method for forming the insulating film of the present invention and the silicon dioxide layer formed by the conventional method.

FIG. 4 shows a graph showing results of comparison, using an optical film thickness measuring apparatus, between a thickness of the silicon dioxide layer 19 obtained by exposing the silicon dioxide layer 19, on which the oxidation inhibiting processing of the present invention has not been performed, to the atmosphere for five hours after having allowed the silicon dioxide layer 19 having a thickness of 2 nm to grow on the silicon crystal substrate 14 and a thickness of the silicon dioxide layer 19 obtained by exposing the silicon dioxide layer 19, on which the oxidation inhibiting processing of the first embodiment and of the second embodiment of the present invention has been performed, to the atmosphere for five hours after having allowed the silicon dioxide layer 19 having the thickness of 2 nm to grow on the silicon crystal substrate 14.

In the graph of FIG. 4, a point shown by a reference number 22 shows the thickness of the silicon dioxide layer 19 on which the oxidation inhibiting processing has not been performed and that, in this case, the silicon dioxide layer 19 having the thickness of 2 nm has grown until it has a thickness exceeding 2.1 nm.

Also, in the graph of FIG. 4, a point shown by a reference number 23 shows the thickness of the silicon dioxide layer 19 itself, on which the oxidation inhibiting processing of the first embodiment has been performed, obtained after having removed the organic gas component by soaking the silicon dioxide layer 19 in a treatment solution containing sulfuric acid, hydrogen peroxide and purified water in a rate of 1:1:1 by weight. Moreover, a point shown by a reference number 24 shows the thickness of the silicon dioxide layer 19 on which the oxidation inhibiting processing of the second embodiment in which the bonding of the silicon atoms is terminated by using the nitrogen atoms has been performed.

Thus, the thickness of the two measured silicon dioxide layers 19 one of which has undergone the oxidation inhibiting processing of the first embodiment of the present invention and the other of which has undergone the oxidation inhibiting processing of the second embodiment, was able to be maintained at 2 nm, even after five hours' exposure to the atmosphere.

Figure 5:
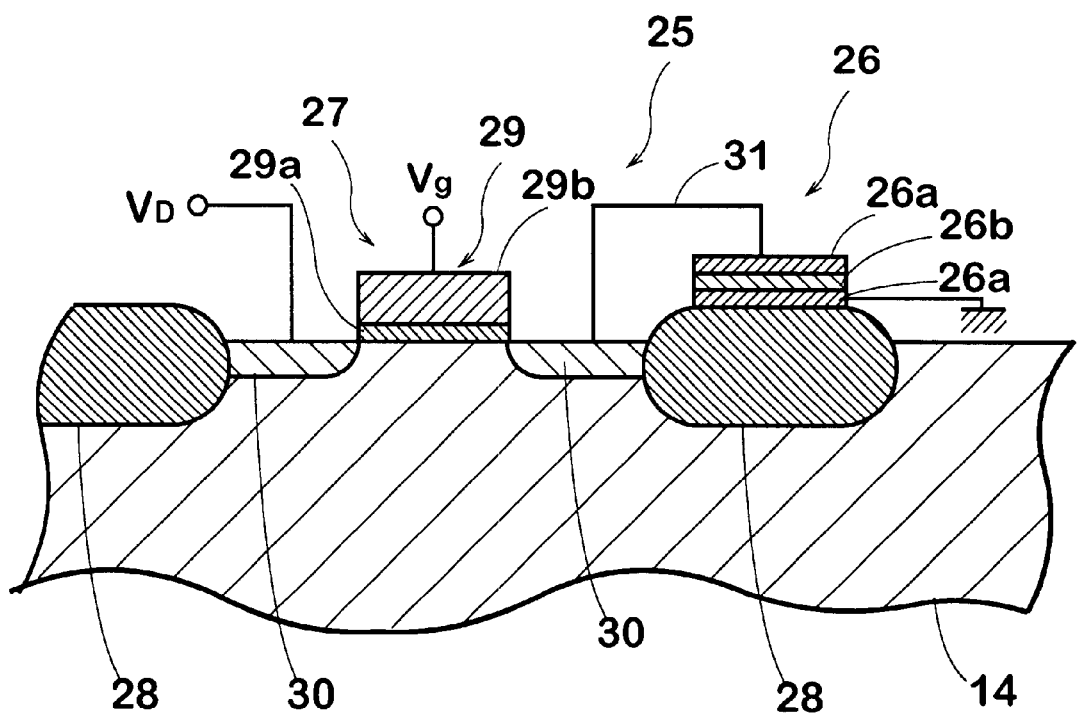
FIG. 5 is a schematic cross-sectional view showing one example of an integrated circuit to which the method for forming the insulating film of the present invention is applied to manufacture the integrated circuit.

FIG. 5 shows an example in which the method for insulating film of the present invention is applied to manufacturing of a semiconductor integrated circuit.

In the example shown in FIG. 5, a memory capacitor 26 making up a memory cell 25 being a dynamic memory and, for example, p-type MOS transistor 27 serving as a switching transistor for the memory capacitor 26.

The MOS transistor 27, as is well known, in an active region partitioned by an element separation region 28 formed on, for example, a p-type silicon crystal substrate 14, has a gate 29 made up of a gate oxide film 29a and a gate electrode 29b and a source / a drain made up of a pair of, for example, n-type conductive impurity regions 30 formed on both sides of the gate.

Moreover, the memory capacitor 26 has a pair of electrodes 26a made up of, for example, a polysilicon layer and a dielectric film 26b interposed between the electrodes 26a.

The method for forming the insulating film of the present invention can be applied to manufacturing of the gate oxide film 29a for the MOS transistor 27 of the memory cell 25 and the dielectric film 26b for the memory capacitor 26 of the memory cell 25.

That is, in the active region on the p-type silicon crystal substrate 14, a silicon dioxide layer 19 for the gate oxide film 29a is formed using the method for the insulating film disclosed in the above embodiments 1 and 2, on which the oxidation inhibiting processing is performed.

After the oxidation inhibiting processing has been performed on the silicon dioxide layer 19, a conductive polysilicon layer for the gate electrode 29b is formed on the silicon dioxide layer 19 by using, for example, a LPCVD (Reduced Pressure CVD) method. When the polysilicon layer is formed by using the LPCVD, an ambient temperature is raised to, for example, 700° C. Therefore, when, for example, the oxidation inhibiting processing employed in the first embodiment is performed on the silicon dioxide layer 19, the organic gas component can be removed by combustion at the same time when the polysilicon layer is formed. Though, at this point, the silicon dioxide layer 19 grows slightly by oxidation of the silicon crystal substrate 14 making up a lower layer of the silicon dioxide layer 19, an amount of the growth is so small as to be negligible, when compared with the amount of the growth caused by the exposure to the atmosphere.

In order to prevent the combustion of the organic gas component at the time of formation of the polysilicon layer, it is preferable that the organic component is removed, immediately before the process of the formation of the polysilicon layer, by using the treatment solution containing sulfuric acid or hydrogen peroxide.

When the oxidation inhibiting processing employed in the second embodiment is performed on the silicon dioxide layer 19, the nitrogen atoms serving to terminate the growth of the silicon dioxide layer 19 binds to silicon atoms to form Si-N bond or binds to oxygen atoms to form O-N bond. Since these bonds are very stable, no change occurs even when the LPCVD is performed to form the polysilicon layer and therefore it does not induce the oxidation of the silicon crystal substrate 14 being the lower layer of the silicon dioxide layer 19, that is, it does not allow the silicon dioxide layer 19 to grow, thus enabling the polysilicon layer to grow smoothly.

Thus, by using the method for forming the insulating film employed in either of the first and second embodiments, it is possible to stack the silicon dioxide layer 19 for the gate oxide film 29a and the conductive polysilicon layer for the gate electrode 29b on the p-type silicon crystal substrate 14, without causing the spontaneous growth of the oxide film on the silicon dioxide layer 19 and, by removing the unwanted portions using well-known photolithography and etching technologies, it is possible to form the gate 29 having the gate oxide film 29a with a desired thickness.

After the formation of the gate 29, as is well known, by implanting selectively desired impurity into desired portions of the silicon crystal substrate 14 using the gate 29 as a mask in accordance with an ion implantation method and by carrying out heat treatment, the MOS transistor 27 is formed.

When the dielectric film 26b for the memory capacitor 26 is formed by using the method for forming the insulating film, after the conductive polysilicon layer for one of the electrodes 26a is formed, the silicon dioxide layer 19 for the dielectric layer 26a is formed in the same way as described above. Then, after the oxidation inhibiting processing has been performed on the silicon dioxide layer 19, the conductive polysilicon layer for the other of the electrodes 26a is stacked.

Since the oxidation inhibiting processing of the present invention is performed on the surface of the silicon dioxide layer 19 for the dielectric film 26b, the oxidation of silicon components of the polysilicon layer existing under the silicon dioxide layer 19 be surely prevented at the time when the polysilicon layer is stacked on the silicon dioxide layer 19 and the increase in thickness of the silicon dioxide layer 19 can be prevented, thus achieving surely prevention of the decrease in the capacity of the capacitor caused by the increase in thickness of the film.

The dielectric film 26b may be configured so as to have, instead of the one-layer structure made up of the silicon dioxide layer 19, as is well known, a two-layer structure made up of a silicon nitride film and the silicon dioxide film or three-layer structure made up of the silicon nitride film interposed between a pair of the silicon dioxide films.

The unwanted portions are removed from stacked layers making up the memory capacitor by the photolithography and etching technologies and, as a result, the memory capacitor 26 is formed. One of the electrodes 26a of the memory capacitor 26 is connected to one of the impurity regions 30 of the MOS transistor 27 through a connection path 31. Between the other of the impurity regions 30 and the other of the electrodes 26a of the memory capacitor 26 is applied a predetermined voltage Vd through a data line (not shown). Moreover, to the gate 29 is applied a gate voltage Vg to be used for writing data to the memory capacitor 26 and reading data from the memory capacitor 26, through a well-known word line (not shown).

It is thus apparent that the present invention is not limited to the above embodiments but may be changed and modified without departing from the scope and spirit of the invention.

For example, in the above embodiments, the method for forming the insulating film is applied to manufacturing of the memory capacitor 26 and the switching transistor of the memory cell, however, the method for forming the insulating film may be used not only for manufacturing components of the memory cell but also for manufacturing insulating films to be used for various integrated circuits. Also, the method for forming the insulating film of the present invention may be used not only for forming components of integrated circuits but also for forming various silicon oxide films requiring accuracy in thickness on materials including silicon.

Moreover, in the above embodiments, in order to cause the insulating film to grow in a manner so as to have a predetermined thickness, the ozone is used, however, the present invention is not limited to the method. The insulating film having the predetermined thickness may be formed by various oxidation methods and the oxidation inhibiting processing of the present invention can be applied to the insulating films having grown by the various oxidation methods. Furthermore, the oxidation inhibiting processing may be used for temporarily preserving the silicon dioxide layer having the predetermined thickness.

What is claimed is:

1. A method for forming an insulating film of silicon dioxide on a silicon crystal comprising:
    growing said silicon dioxide as having a predetermined thickness on said silicon crystal; and
    inhibiting oxidation of said silicon dioxide formed by said growing, by exposing said silicon dioxide to a gas containing no oxygen.

2. The method for forming an insulating film according to claim 1, wherein the gas is ammonia gas.

3. The method for forming an insulating film according to claim 2, wherein nitrogen atoms from the ammonia gas bind to dangling bonds of silicon atoms existing on a surface of said silicon dioxide, to inhibit oxidation.

4. The method for forming an insulating film according to claim 1, wherein the gas is an organic gas.

5. The method for forming an insulating film according to claim 4, wherein said organic gas is paraffin low-molecular gas.

6. The method for forming an insulating film according to claim 4, wherein said growing comprises exposing said silicon dioxide to an atmosphere of ozone and, after said silicon dioxide has grown to the predetermined thickness, said ozone in said atmosphere is replaced with nitrogen gas or inert gas, and then the organic gas containing no hydroxyl group is introduced into said atmosphere to expose a surface of said silicon dioxide.

7. The method for forming an insulating film according to claim 4, wherein carbon atoms from the organic gas bind to dangling bonds of silicon atoms existing on a surface of said silicon dioxide, to inhibit oxidation.

8. A method for forming an insulating film of silicon dioxide on a silicon crystal comprising:
    growing said silicon dioxide having a predetermined thickness on a surface of said silicon crystal; and
    terminating binding of dangling bonds of a silicon atom on a surface of said silicon dioxide by causing nitrogen atoms to bind to said dangling bonds of said silicon atom,
    wherein said growing comprises exposing a crystal face of said silicon dioxide to an atmosphere of ozone and, after said silicon dioxide has grown to the predetermined thickness, said ozone in said atmosphere is replaced with nitrogen gas or inert gas, and then ammonia gas is introduced into said atmosphere to cause dangling bonds of silicon atoms on the surface of said silicon dioxide to bind to nitrogen atoms.

9. A method for manufacturing an integrated circuit comprising:
    forming an insulating film of silicon dioxide on a silicon crystal,
    said forming includes growing said silicon dioxide as having a predetermined thickness on a surface of said silicon crystal by exposing a crystal face of said silicon crystal to an atmosphere of ozone, replacing said ozone in said atmosphere with nitrogen gas or inert gas after said silicon dioxide has grown to the predetermined thickness, and subsequently inhibiting oxidation of said silicon dioxide formed by said growing by introducing a gas containing no oxygen into said atmosphere.

10. The method for manufacturing an integrated circuit according to claim 9, wherein said insulating film is a gate insulator of a field effect transistor or a dielectric film of a capacitor.

11. The method for manufacturing an integrated circuit of claim 9, wherein the gas is an organic gas.

12. The method for manufacturing an integrated circuit of claim 11, wherein carbon atoms from the organic gas bind to dangling bonds of silicon atoms existing on a surface of said silicon dioxide, to inhibit oxidation.

13. The method for manufacturing an integrated circuit of claim 11, wherein the organic gas is paraffin low-molecular gas.

14. The method for manufacturing an integrated circuit of claim 9, wherein the gas is ammonia gas.

15. The method for manufacturing an integrated circuit of claim 14, wherein nitrogen atoms from the ammonia gas bind to dangling bonds of silicon atoms existing on a surface of said silicon dioxide, to inhibit oxidation.

16. A method for manufacturing an integrated circuit comprising:
    forming an insulating film of silicon dioxide on a silicon crystal,
    said forming includes growing said silicon dioxide as having a predetermined thickness on a surface of said silicon crystal by exposing a crystal face of said silicon crystal to an atmosphere of ozone, replacing said ozone in said atmosphere with nitrogen gas or inert gas after said silicon dioxide has grown to the predetermined thickness, and subsequently inhibiting oxidation of said silicon dioxide formed by said growing by introducing into said atmosphere a gas having no oxygen and which includes atoms that bind to dangling bonds of silicon atoms on a surface of said silicon dioxide.

17. The method for manufacturing an integrated circuit according to claim 16, wherein said insulating film is a gate insulator of a field effect transistor or a dielectric film of a capacitor.

18. The method for manufacturing an integrated circuit according to claim 16, wherein the gas is an organic gas.

19. The method for manufacturing an integrated circuit according to claim 18, wherein carbon atoms from the organic gas bind to the dangling bonds of the silicon atoms existing on the surface of said silicon dioxide, to inhibit oxidation.

20. The method for manufacturing an integrated circuit according to claim 16, wherein the gas is ammonia gas.

21. The method for manufacturing an integrated circuit according to claim 20, wherein nitrogen atoms from the ammonia gas bind to the dangling bonds of the silicon atoms existing on the surface of said silicon dioxide, to inhibit oxidation.

* * * * *